United States Patent [19]
Kadomura

[11] Patent Number: 5,342,481
[45] Date of Patent: Aug. 30, 1994

[54] DRY ETCHING METHOD

[75] Inventor: Shingo Kadomura, Kanagawa, Japan

[73] Assignee: Sony Corporation, Tokyo, Japan

[21] Appl. No.: 835,324

[22] Filed: Feb. 14, 1992

[30] Foreign Application Priority Data

Feb. 15, 1991 [JP] Japan .................. 3-042414

[51] Int. Cl.$^5$ ............................ H01L 21/00
[52] U.S. Cl. .................. 156/659.1; 156/660; 156/643; 156/646; 156/653; 430/5
[58] Field of Search .......... 156/643, 646, 659.1, 156/651, 653, 660, 668; 403/5

[56] References Cited

U.S. PATENT DOCUMENTS

| | | | |
|---|---|---|---|
| 5,091,342 | 2/1992 | Studebaker et al. | 437/228 |
| 5,139,925 | 8/1992 | Hartney | 430/326 |
| 5,177,773 | 1/1993 | Oizumi et al. | 378/34 |
| 5,188,706 | 2/1993 | Hori et al. | 156/643 |

FOREIGN PATENT DOCUMENTS

| | | |
|---|---|---|
| 63-124417 | 5/1988 | Japan . |
| 01239932 | 9/1989 | Japan . |
| 03141632 | 6/1991 | Japan . |

Primary Examiner—R. Bruce Breneman
Assistant Examiner—George Goudreau
Attorney, Agent, or Firm—Hill, Steadman & Simpson

[57] ABSTRACT

A method for effecting anisotropic etching of a layer of a material without producing dimensional loss even if the photoresist is of a reverse tapered cross-sectional profile is proposed. A photoresist produced from a chemical amplification negative type photoresist tends to be of a reversely tapered cross-sectional profile after development due to its sensitization properties. According to the present invention, discharge reaction products yielded in a plasma are deposited on an inclined sidewall surface of a photoresist pattern for trimming or shaping the sidewall surface so that the sidewall surface will be substantially vertical. For example, $Si_xN_y$, $Si_xN_yCl_z$, etc. may be deposited from a $SiCl_4/N_2$ mixed gas, sulfur may be deposited from a mixed gas of $S_2F_2/H_2S$ and a carbonaceous polymer may be deposited from a $C_2Cl_3F_3$ gas. Such profile correction may be effected before etching the layer, or simultaneously with the etching under conditions in which the deposition process occurs competitively with the etching process. According to the present invention, dimensional loss may be prevented effectively from occurring during the etching of a layer of an Si-based material or an Al-based material in which the radical mode is a prevailing etching mode.

8 Claims, 2 Drawing Sheets

DRY ETCHING METHOD

BACKGROUND OF THE INVENTION

1. Field of the Invention

This invention relates to a dry etching method and, more particularly, to a dry etching method in which a dimensional loss may be prevented from being produced even if etching is carried out using a reverse tapered resist pattern as a mask.

2. Description of Related Art

In keeping pace with increased refinement of the design rule of semiconductor devices, such as VLSIs and ULSIs, researches in the field of photolithography are currently conducted with a view to improving the photoresist material as well as increasing the numerical aperture of exposure units or shortening the exposure wavelengths. Above all, excimer laser lithography employing an excimer laser light source, such as KrF excimer laser light (248 nm) in place of a conventional g-line (436 nm) or i-line (365 nm) of high pressure mercury lamps, has attracted attention as a technique of achieving high resolution with comparative ease.

Meanwhile, it is difficult in excimer laser lithography to directly use a novolac positive type photoresist, which has hitherto been customarily used in g-line exposure or i-line exposure. The reason is that, since the aromatic ring of the novolac base resin and the naphthoquinone diazide compounds used as a photosensitive material exhibits marked absorption in a wavelength range of the KrF excimer laser light, the photoresist is poor in sensitivity and in exposure light transmission properties so that the photoresist pattern becomes tapered in cross-section.

Thus a photoresist material capable of achieving high sensitivity and high resolution has been desired. Recently, a so-called chemical amplification resist has attracted attention as such photoresist. The chemical amplification resist is a photoresist of the type in which an acid catalyst is generated by photoreaction from a photoreactive acid catalyst generator, such as an onium salt or a polyhalide, referred to hereinafter as photoacid generator, and in which heat treatment (post-baking) is carried out in the presence of the acid catalyst to proceed with a resist reaction, such as cross-linking or functional group conversion, thereby producing changes in the rate of dissolution.

The chemical amplification resist is classified into a positive type and a negative type, depending on the type of the resist reaction, and into a two-component system and a three-component system, depending on the number of basic components. Currently, a negative three-component type resist, employing novolac resin, DDT (p,p'-dichlorodiphenyl trichloroethane) and hexamethyrol melamine, as a basic resin, photo-acid generator and an acid crosslinking agent, respectively, is nearing the stage of practical utilization. Resolution achieved by this resist is based on a mechanism that the acid catalyst is generated from DDT by exposure by a KrF excimer laser, which acid catalyst promotes cross-linking of the base resin by the cross-linking agent during post-baking to render the light exposed portion alkali-insoluble.

However, the above mentioned negative type chemical amplification resist tends to be affected by exposure light volume distribution in a direction along the film thickness and becomes more difficult to dissolve on the surface and the near-by region of the exposed portion, so that the as-developed resist exhibits a characteristic reversed tapered cross-sectional profile. Such deterioration in the cross-sectional shape of the resist pattern may translate itself into dimensional loss, when etching is made with the resist pattern as a mask, depending on the particular etching mechanism employed.

It is now assumed that, as shown in FIG. 1a, a layer of a material 2, formed on a substrate 1, is etched, using a photoresist pattern 3 as a mask. The photoresist pattern 3 is not a rectangular pattern having an upright wall but is a pattern of a reversed taper having a pattern width $d_2$ on the bottom surface of the pattern adjacent the layer 2, which width $d_2$ is less than a pattern width $d_1$ on the top surface of the pattern ($d_1 > d_2$). The width $d_1$ is the desired or targeted pattern width.

If the layer 2 is etched using such a photoresist pattern 3 as a mask, and the layer 2 is of a material that is etched mainly by an ion mode, such as silicon oxide, the pattern width of the as-etched layer 2 becomes equal to the pattern width $d_1$, as shown in FIG. 1b. The reason is that, when etching a fine pattern mainly by the ion mode, the operating conditions of low gas pressure and high bias voltage are adopted, so that the mean free path of the ions $i^+$ is extended and the incident direction is set so as to be substantially normal to the layer 2 being etched, with the result that the range of incidence of the ions $i^+$ is regulated by the width $d_1$ on the top surface of the photoresist pattern 3.

However, if the layer 2 is of a material that is etched mainly by the radical mode, such as, for example, polysilicon or aluminum-based material, the pattern width of the as-etched layer 2 becomes substantially equal to the pattern width $d_2$. The reason is that, in distinction from ions, radicals $r^*$ cannot be aligned in their proceeding direction, so that etching proceeds from the bottom surface of the resist pattern 3 under the influences of the predominant obliquely incident components. The result is that a difference that represents a dimensional loss is produced between the targeted pattern width $d_1$ and the produced pattern width $d_2$.

In this manner, if the resist pattern has a reverse tapered cross-sectional profile, a dimensional loss is produced, depending on the type of the layer to be etched. However, such dimensional loss is not tolerated under the increasingly refined current design rule.

OBJECT AND SUMMARY OF THE INVENTION

It is an object of the present invention to provide a dry etching method whereby, even when the as-developed resist pattern exhibits a reverse tapered profile, the layer to be etched may be etched at all times free of any dimensional loss without dependency on the type of the material.

The present inventor has arrived at the present invention on the basis of the concept of correcting the cross-sectional profile of the resist pattern before or in the course of etching for eliminating the dimensional loss.

According to a first method of correcting the cross-sectional profile of the resist pattern, discharge reaction products are deposited on an inclined sidewall section of the reverse tapered sidewall section of the resist pattern, and the etching mask profile is corrected so as to be substantially normal to the layer to be etched before proceeding to etching. The discharge reaction products may be deposited from the gaseous phase in the course of the usual dry etching under conditions of relatively lowered incident ion energy. Since such deposition tends to be promoted in a narrow region sandwich between the inclined sidewall surface of the resist pattern and the surface of the layer being etched, the ultimate sidewall surface of the mask is corrected to be substantially normal to the layer of the material being etched. The result is that etching to the targeted pattern width may be achieved in a manner free of any dimensional loss not only in the case in which subsequent etching is based mainly on the ion mode but in the case in which the subsequent etching is based mainly on the radical mode.

According to a second method of correcting the cross-sectional profile of the resist pattern, etching of the layer and correction of the resist pattern are effected simultaneously. In this case, the operating conditions, such as incident ion energies, may be optimized so that ion sputtering and deposition may proceed competitively. In this manner, the effects similar to those produced with the first method may be produced.

According to the present invention, dimensional loss may be prevented with any of the above methods, without dependency on the type of the layer of the material to be etched, even though the mask is of the reversed tapered profile. The present invention is highly effective in a process in which, in executing fine processing to a submicron or quarter micron size level, excimer laser lithography and the chemical amplification negative type photoresist suited to such exposure wavelength are applied.

BRIEF DESCRIPTION OF THE DRAWINGS

FIGS. 1a and 1b are schematic cross-sectional views for illustrating problems encountered in conventional etching methods directly using a reverse tapered photoresist pattern as a mask, wherein FIG. 1a shows a process step for forming a reverse tapered photoresist pattern and FIG. 1b shows the state in which etching by an ion mode has been completed.

FIGS. 3a to 3c are schematic cross-sectional views for illustrating an etching method according to an embodiment of the present invention, step by step, wherein FIG. 3a shows a step of forming a reverse tapered photoresist pattern, FIG. 3b shows a step of trimming the photoresist pattern by formation of a spacer, and FIG. 3c shows the state in which a doped polysilicon layer has been etched using the photoresist pattern and the spacer as masks.

DETAILED DESCRIPTION OF THE INVENTION

The present invention will be explained in detail with reference to non-limitative Examples.

EXAMPLE 1

In the present Example, the present invention is applied to gate processing, in which a reverse tapered resist pattern is trimmed using discharge reaction products from a SiCl$_4$/N$_2$ mixed gas system and a doped polysilicon layer is subsequently etched using HBr. The process is explained by referring to FIGS. 3a to 3c.

Figure 1A:
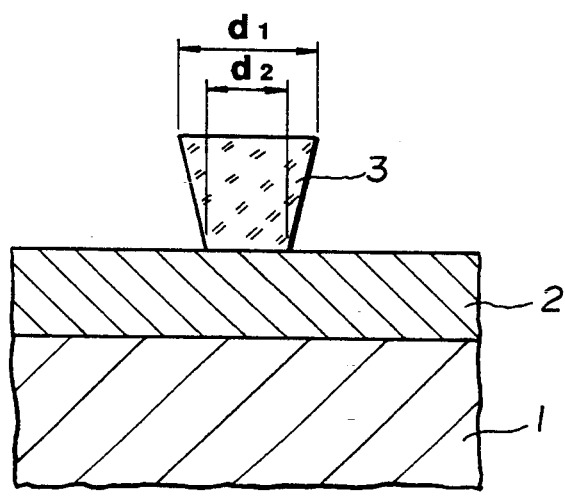
Figure 1B:
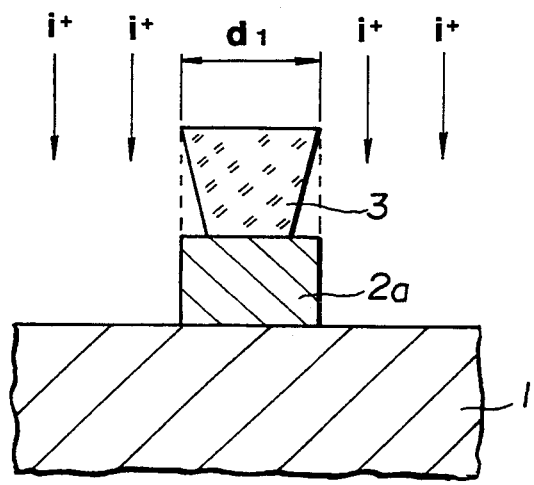
Figure 2:
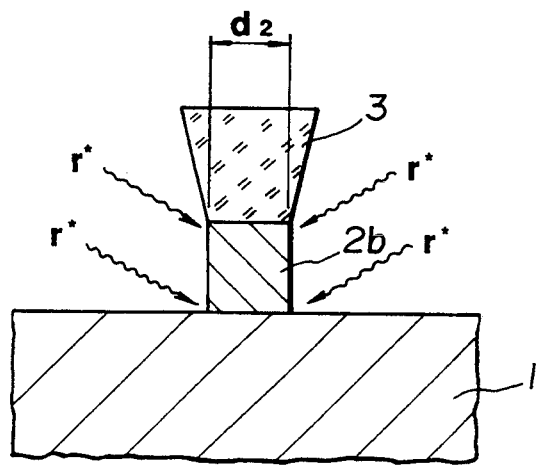
FIG. 2 is a schematic cross-sectional view similar to FIG. 1b and shows the state in which etching by radical mode has been completed.
Figure 3A:
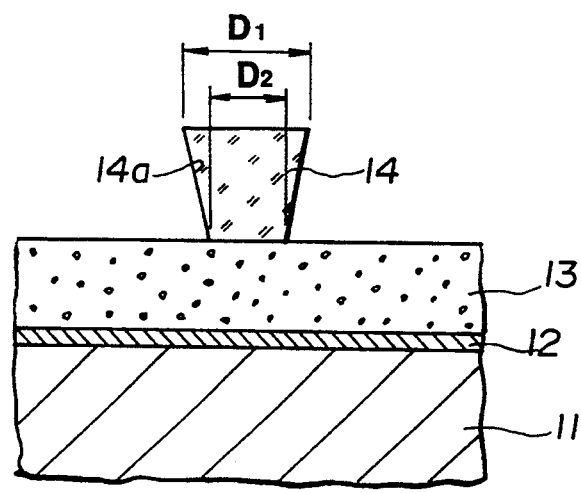
Figure 3B:
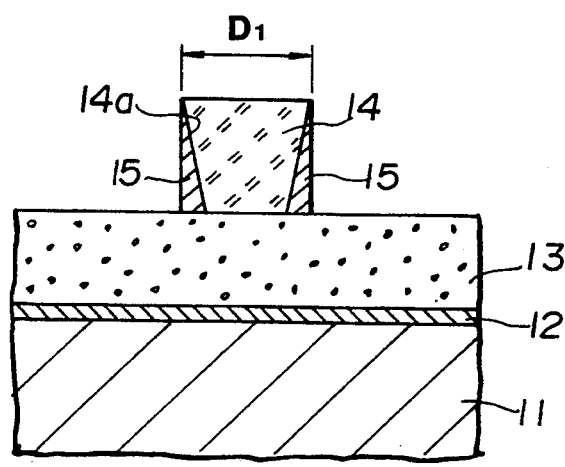

Referring first to FIG. 3a, a doped polysilicon layer 13 was formed on a semiconductor substrate 11 of, for example, silicon, with interposition of a gate oxide film 12. A negative type chemical amplification photoresist, manufactured and sold by SHIPLAY Inc. under the trade name of SAL-601 was applied on the surface of the doped polysilicon layer 13 to form a photoresist layer of 1 μm thick. Selective light exposure was effected using a KrF excimer laser stepper and a photoresist pattern 14 was formed by the process steps of postbaking and alkali development to produce a wafer. The photoresist pattern 14 presented a reverse tapered cross-sectional shape with an inclined sidewall surface 14a. A pattern width D$_1$ on the top surface was 0.4 μm, while a pattern width D$_2$ on the bottom surface was 0.3 μm.

The wafer thus produced was set on a magnetically-enhanced microwave plasma etching device and plasma-processed under typical processing conditions of a SiCl$_4$ flow rate of 10 SCCM, an N$_2$ flow rate of 10 SCCM, a gas pressure of 1.3 Pa (10 mTorr), a microwave power of 850 W (2.45 GHz) and an RF bias power of 0 W.

As a result of the plasma processing, discharge reaction products were deposited on an inclined sidewall surface 14a of the photoresist pattern 14 to form a spacer 15. The cross-sectional profile of the mask was trimmed or shaped to substantially a rectangular shape.

The SiCl$_4$/N$_2$ gas system used herein is disclosed in the inventor's pending JP Patent KOKAI Publication 63-73526 (1988), in which it is stated that the gas was successfully used in silicon trench etching. With this prior-art technology, reaction products of the compositions of Si$_x$N$_y$ or Si$_x$N$_y$Cl$_z$, yielded on electrical discharge from the gaseous phase, are used for sidewall protection for achieving satisfactory anisotropic etching. In the present Example, these discharge reaction products make up the spacer 15. However, since the RF bias is not applied herein, the doped polysilicon layer 13 as an underlying layer is not etched. However, since the optimum plasma-processing conditions are set, the cross-sectional profile of the mask was trimmed satisfactorily by a mechanism in which the deposition of the discharge reaction products proceeded preferentially in a narrow corner region defined between the inclined sidewall surface 14a and the surface of the doped polysilicon layer 13 and sputtering proceeded preferentially in a region widely exposed to the plasma, as in a region overlying the inclined sidewall surface 14a.

Although the above trimming may also be achieved by a two-step process consisting of deposition of reaction products on the entire wafer surface and subsequent etchback, the method of the present Example is preferred because the trimming may be achieved by a single process step without the risk of damage by overetching.

The doped polysilicon layer 13 was then etched by the same magnetically-enhanced microwave plasma etching device, using the photoresist pattern 14 and the spacer 15 as masks, under typical processing conditions of an HBr flow rate of 50 SCCM, a gas pressure of 1.3 Pa (10 mTorr), a microwave power of 850 W (2.45 GHz) and an RF bias power of 100 W (2 MHz).

Figure 3C:
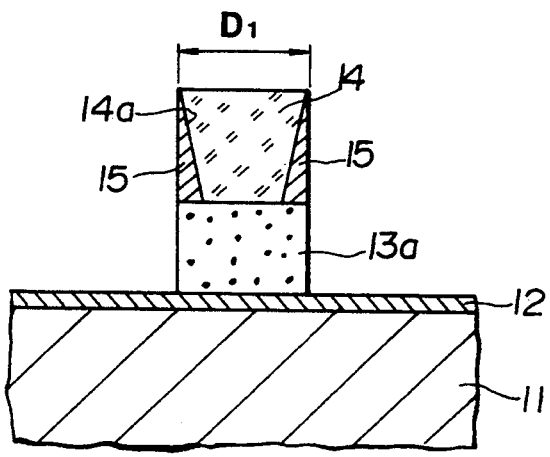

It is noted that radicals Br* derived from HBr are of a larger atomic radius and are not intruded into crystal lattices or into the crystal grain boundary of the silicon-based material, so that spontaneous etching is not produced with these radicals. However, etching may proceed with these radicals only when the etching is accompanied by ion impacts. Hence, HBr is excellent in achieving high shape anisotropy. On the other hand, a process employing HBr is effective as post-CFC (chlorofluorocarbon gas) measures. By this etching, a gate electrode 13a having a pattern width $D_1$ as shown in FIG. 3c was formed with good shape anisotropy.

EXAMPLE 2

In the present example 2, the present invention was applied to gate processing, wherein a reverse tapered resist pattern was trimmed by discharge reaction products from an $S_2F_2/H_2S$ mixed gas system and a doped polysilicon layer was subsequently etched using $S_2F_2$.

Similarly to Example 1, a reverse tapered photoresist pattern 14 was formed on a doped polysilicon layer 13 to form a wafer, which was then set on a wafer setting electrode of a magnetically-enhanced microwave plasma etching device. The wafer setting electrode was so designed that a cooling medium was introduced and circulated in an enclosed cooling conduit from a cooling system such as a chiller provided outside the device for cooling the wafer to 0° C. or lower. Ethanol was used herein as the cooling medium. Plasma processing was performed under typical processing conditions of an $S_2F_2$ flow rate of 5 SCCM, an $H_2S$ flow rate of 10 SCCM, a gas pressure of 1.3 Pa (10 mTorr), a microwave power of 850 W (2.45 GHz), an RF bias power of 10 W (2 MHz) and a wafer temperature of −30° C.

It is noted that $S_2F_2$ is one of sulfur fluorides proposed by the present inventors as a gas for dry etching in the copending JP Patent Application No. 2-198045 (1990), and may be dissociated on microwave discharge to produce free sulfur. Meanwhile, plasma processing is aimed at trimming the cross-sectional shape of the photoresist pattern 14, while the doped polysilicon layer 13 should not be etched by F* radicals before trimming. For this reason, $H_2S$ is added to the gas system so that excess F* will be captured by H* derived from $H_2S$. Sulfur yielded from both $S_2F_2$ and $H_2S$ was adsorbed on the surface of the chilled wafer. However, it was immediately sputtered off by ions accelerated by the lower RF bias power from the surface on which ions were incident in the perpendicular direction, and were selectively deposited on the pattern sidewall section where ions were not incident.

By the above described mechanism, sulfur was deposited on the inclined sidewall surface 14a of the photoresist pattern 14 to form the spacer 15 so that the cross-sectional profile of the mask could be trimmed to substantially a rectangular profile.

The doped polysilicon layer 13 was then etched, using the photoresist pattern 14 and the spacer 15 as masks, under typical operating conditions of an $S_2F_2$ flow rate of 5 SCCM, a gas pressure of 1.3 Pa (10 mTorr), a microwave power of 850 W (2.45 GHz), an RF bias power of 30 W (2 MHz) and a wafer temperature of −30° C.

During this process, etching proceeded while a sidewall protection film of sulfur, not shown, was formed on the pattern sidewall section, and a gate electrode 13a with good shape anisotropy was formed without producing dimensional loss. The spacer 15 and the sidewall protection film, both formed of sulfur, could easily be sublimed off on heating the wafer to a temperature of an order of 100° C., after the end of etching, without producing pollution by particles.

Meanwhile, high selectivity of the gate oxide film 12 could be achieved simultaneously, chiefly because the radical reaction was suppressed by the chilling of the wafer and by consumption of excess F* and because the RF bias power could be diminished in an amount corresponding to sidewall protection. In addition, since the photoresist pattern 14 was sputtered off to a limited extent under the low bias conditions, resist selectivity was improved, while the pollution by particles of the carbonaceous polymer could be prevented from being produced.

Meanwhile, although $S_2F_2$ was used in the present Example as a gas for plasma processing and etching of the doped polysilicon layer 13, sulfur compounds containing both sulfur and halogen elements, such as, for example, $SF_2$, $SF_4$, $S_2F_{10}$, $S_3Cl_2$, $S_2Cl_2$, $SCl_2$, $SOF_2$ or $SOCl_2$, may also be employed.

As the gases used for capturing excess F* or Cl* produced due to the use of these sulfur compounds, $H_2$, silane-based gases, such as, for example, $SiH_4$, $Si_2H_6$, $Si_3H_8$, $SiH_2F_2$ or $SiH_2Cl_2$, may also be employed besides $H_2S$. Above all, when the silane-based gases are used, Si-based active species are produced, besides H*, for effectively contributing to capturing of halogen radicals.

In addition, $O_2$ may also be added for controlling the etchrate, while rare gases, such as He or Ar, may be added suitably in expectation of dilution, cooling or sputtering effects.

EXAMPLE 3

In the present example 3, the present invention was applied to gate processing and a doped polysilicon layer was etched at the same time that a reverse tapered resist pattern was trimmed by a carbonaceous polymer produced from $C_2Cl_3F_3$ (CFC 113).

In the present Example, a wafer shown in FIG. 3a was set on a magnetically-enhanced microwave plasma etching device, and was etched under typical operating conditions of a $C_2Cl_3F_3$ flow rate of 55 SCCM, and $SF_6$ flow rate of 5 SCCM, a gas pressure of 1.3 Pa (10 mTorr), a microwave power of 850 W (2.45 GHz) and an RF bias power of 100 W (2 MHz).

During this etching process, the carbonaceous polymer yielded from the gaseous phase on discharge dissociation of $C_2Cl_3F_3$ gas was deposited on the inclined sidewall surface 14a to trim the photoresist pattern 14, at the same time that the doped polysilicon layer 13 was continuously etched, so that anisotropic etching could be achieved without dimensional loss.

Meanwhile, the above etching gas system is selected for achieving sidewall protection, high etchrate and high selectivity in terms of underlying silicon oxide layer by mixing fluorocarbon-based deposition gas and a non-carbonaceous fluorine-containing gas as a fluorine radical supply source. However, the gas composition may be changed optionally.

For example, $C_2Cl_2F_4$ (CFC 114) or $C_2ClF_5$ (CFC 115) may be used in place of $C_2Cl_3F_3$, or a mixture of a halogen gas and a fluorocarbon gas, such as $CH_2F_2$, $CF_4$, $C_2F_6$, $C_3F_8$ or $CHF_3$, may also be used in consideration of future regulations possibly imposed on the CFC gases.

As non-carbonaceous fluorine-containing gases, $NF_3$, $SiF_4$ etc. may also be used besides $SF_6$.

In addition, inert gases may suitably be added to the above gas system.

EXAMPLE 4

In the present Example, the present invention was applied to processing an Al metallization, and a reverse tapered photoresist pattern was trimmed by sulfur produced from an $S_2Cl_2/H_2$ mixed gas, while an Al alloy layer and a barrier metal layer were etched simultaneously.

In a wafer employed in the present Example, it is the barrier metal layer and the Al alloy layer deposited sequentially on an insulating layer, that are to be etched, although an explanation by referring to the drawings is not made herein. The barrier metal layer is a two-layer structure comprised of a Ti layer and a TiON layer, deposited in this sequence from the insulating film, while the Al alloy layer may for example be Al-1% Si deposited such as by sputtering. A reverse tapered photoresist pattern was formed on the Al alloy layer in the same manner as in Example 1.

A wafer thus produced was set on a magnetically-enhanced microwave plasma etching device, and was etched under typical operating conditions of an $S_2Cl_2$ flow rate of 50 SCCM, an $H_2$ flow rate of 20 SCCM, a gas pressure of 1.3 Pa (10 mTorr), a microwave power of 850 W (2.45 GHz), an RF bias power of 50 W (2 MHz) and a wafer temperature of $-30°$ C.

The $S_2Cl_2$ gas is among sulfur chlorides previously proposed by the present inventor as a dry etching gas and may be dissociated on microwave discharge to yield sulfur and Cl*. However, since it is necessary with this process to effect trimming of the cross-sectional shape of the photoresist pattern simultaneously with etching of the Al alloy layer, while no dimensional loss due to excess radicals should be produced, $H_2$ is added to the gas system for capturing excess Cl* radicals. As a result thereof, the apparent Cl/S ratio (the ratio of the number of chlorine atoms to that of sulfur atoms) in the etching reaction system is diminished, while the effects of the radicals are suppressed at the same time that an environment which will assist sulfur deposition is provided. As a result thereof, produced sulfur was deposited on the inclined sidewall surface to trim the photoresist pattern, at the same time that the Al alloy film and the barrier metal layer continued to be etched, so that an Al metallization could be formed with good shape anisotropy without producing dimensional loss.

Meanwhile, the above mentioned etching conditions are aimed at achieving high anisotropy by wafer cooling and sulfur deposition even under low bias conditions, while decomposition products of the photoresist pattern are not used for sidewall protection. Thus, there is the least risk of residual chlorine being taken into the decomposition products. In general, how to prevent the after-corrosion ascribable to residual chlorine poses a serious problem in the processing of the Al metallization having a barrier metal structure. The process of the present Example provides effective measures for combatting the problem.

What is claimed is:

1. A dry etching method for etching a layer of a material using a resist pattern having an inclined sidewall section formed by a pattern width decreased from a top surface towards a bottom surface along a film thickness of the pattern, comprising:

forming discharge reaction products and allowing the discharge reaction products to be deposited on said inclined sidewall surface for shaping said sidewall section of the mask so that said sidewall section will be substantially perpendicular to said layer, and subsequently plasma etching said layer.

2. A dry etching method as claimed in claim 1 wherein said resist pattern is constituted by a chemical amplification negative type photoresist material.

3. A dry etching method as claimed in claim 1 wherein said layer is formed of a material etched by a mechanism having a radical mode as a prevalent etching mode.

4. A dry etching method as claimed in claim 1 wherein said discharge reaction products are at least one product selected from a group consisting of silicon compounds, sulfur and carbonaceous polymers.

5. A dry etching method for etching a layer of a material using a resist pattern having an inclined sidewall section formed by a pattern width decreased from a top surface towards a bottom surface along a film thickness of the pattern, comprising:

forming discharge reaction products and allowing the discharge reaction products to be deposited on said inclined sidewall surface for shaping said sidewall section of the mask so that said sidewall section will be substantially perpendicular to said layer, and simultaneously plasma etching said layer.

6. A dry etching method as claimed in claim 5 wherein said resist pattern is constituted by a chemical amplification negative type photoresist material.

7. A dry etching method as claimed in claim 5 wherein said layer is formed of a material etched by a mechanism having a radical mode as a prevalent etching mode.

8. A dry etching method as claimed in claim 5 wherein said discharge reaction products are at least one from a group consisting of silicon compounds, sulfur and carbonaceous polymers.

* * * * *